(12) United States Patent
Hu

(10) Patent No.: US 7,659,179 B2
(45) Date of Patent: Feb. 9, 2010

(54) METHOD OF FORMING TRANSISTOR USING STEP STI PROFILE IN MEMORY DEVICE

(75) Inventor: Hyun Hu, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/322,843

(22) Filed: Dec. 29, 2005

(65) Prior Publication Data

US 2006/0223263 A1 Oct. 5, 2006

(30) Foreign Application Priority Data

Mar. 31, 2005 (KR) .................... 10-2005-0027298

(51) Int. Cl.
*H01L 21/76* (2006.01)
(52) U.S. Cl. .................... 438/418; 438/419; 438/420; 438/433; 438/447; 438/449; 257/542; 257/591
(58) Field of Classification Search ............... 438/221, 438/297, 424, 435
See application file for complete search history.

(56) References Cited

U.S. PATENT DOCUMENTS

| | | | | |
|---|---|---|---|---|
| 5,300,804 A * | 4/1994 | Arai | ............................ | 365/104 |
| 5,571,738 A * | 11/1996 | Krivokapic | .................... | 438/291 |
| 5,581,101 A * | 12/1996 | Ning et al. | .................... | 257/347 |
| 5,698,873 A * | 12/1997 | Colwell et al. | ............. | 257/206 |
| 5,795,801 A * | 8/1998 | Lee | ............................ | 438/199 |
| 5,811,334 A * | 9/1998 | Buller et al. | ................ | 438/264 |
| 5,861,104 A * | 1/1999 | Omid-Zohoor | ............. | 216/84 |
| 6,025,635 A * | 2/2000 | Krivokapic | .................... | 257/412 |
| 6,083,795 A * | 7/2000 | Liang et al. | .................... | 438/289 |
| 6,177,317 B1 * | 1/2001 | Huang et al. | ................ | 438/263 |
| 6,228,727 B1 * | 5/2001 | Lim et al. | .................... | 438/296 |
| 6,291,298 B1 | 9/2001 | Williams et al. | | |
| 6,368,922 B1 * | 4/2002 | Yu | .............................. | 438/275 |
| 6,465,820 B1 * | 10/2002 | Fox | ............................. | 257/223 |
| 6,680,239 B1 * | 1/2004 | Cha et al. | .................... | 438/435 |
| 6,762,104 B2 * | 7/2004 | Suh et al. | .................... | 438/303 |
| 6,767,813 B2 * | 7/2004 | Lee et al. | .................... | 438/585 |
| 6,946,338 B2 * | 9/2005 | Lee | ............................. | 438/217 |
| 7,105,410 B2 * | 9/2006 | Lin et al. | .................... | 438/270 |

(Continued)

FOREIGN PATENT DOCUMENTS

KR 10-2001-0053905 A 7/2001

(Continued)

OTHER PUBLICATIONS

Taiwan Intellectual Property Office, Office Action, Application No. 094147850, Mar. 12, 2008.

*Primary Examiner*—Fernando L Toledo
*Assistant Examiner*—Ankush K Singal
(74) *Attorney, Agent, or Firm*—Townsend and Townsend and Crew LLP

(57) ABSTRACT

A method of forming a memory device includes forming first and second isolation structures on a semiconductor substrate, the first and second isolation structures defining an active region therebetween; and etching a portion of the semiconductor substrate provided within the active region to define a step profile, so that the active region includes a first vertical portion and an upper primary surface, the first vertical portion extending above the upper primary surface.

11 Claims, 4 Drawing Sheets

U.S. PATENT DOCUMENTS

| | | | |
|---|---|---|---|
| 7,176,138 B2 * | 2/2007 | Chen et al. | 438/700 |
| 7,244,650 B2 * | 7/2007 | Suh | 438/253 |
| 7,387,942 B2 * | 6/2008 | Wang et al. | 438/433 |
| 2001/0015046 A1 | 8/2001 | Hong | |
| 2002/0151136 A1 * | 10/2002 | Lin et al. | 438/259 |
| 2002/0190799 A1 * | 12/2002 | Morimoto et al. | 331/57 |
| 2003/0003643 A1 * | 1/2003 | Bromberger et al. | 438/200 |
| 2003/0011019 A1 | 1/2003 | Inoue | |
| 2003/0032261 A1 * | 2/2003 | Yeh et al. | 438/451 |
| 2003/0060014 A1 * | 3/2003 | Neidhart et al. | 438/270 |
| 2004/0079987 A1 * | 4/2004 | Shimizu | 257/315 |
| 2004/0156247 A1 * | 8/2004 | Cho et al. | 365/200 |
| 2005/0040475 A1 * | 2/2005 | Jang et al. | 257/396 |
| 2005/0153513 A1 * | 7/2005 | Lee et al. | 438/287 |
| 2005/0156213 A1 * | 7/2005 | Han et al. | 257/292 |
| 2006/0017093 A1 * | 1/2006 | Kwon et al. | 257/315 |
| 2006/0079068 A1 * | 4/2006 | Sheu et al. | 438/433 |
| 2006/0145200 A1 * | 7/2006 | Yoo | 257/270 |
| 2006/0205152 A1 * | 9/2006 | Shin | 438/257 |
| 2007/0082448 A1 * | 4/2007 | Kim et al. | 438/268 |

FOREIGN PATENT DOCUMENTS

| | | |
|---|---|---|
| KR | 10-2001-0064596 A | 7/2001 |
| TW | 466753 B | 12/2001 |

* cited by examiner

METHOD OF FORMING TRANSISTOR USING STEP STI PROFILE IN MEMORY DEVICE

BACKGROUND OF THE INVENTION

The present invention relates to a method for forming a transistor of a memory device using a step Shallow Trench Isolation (STI) profile.

In general, a semiconductor memory device having a small cell size, such as a NAND flash memory device, has been used as a large-capacity storage of portable device. The NAND flash memory has been adapted to provide miniaturization and reduce the cost per bit while maintaining the characteristics of the memory device. The size of a transistor in the cell region and the peripheral region needs to be reduced to reduce the cost per bit for the NAND device. The reduction in cell size in the cell and peripheral regions, however, generally results in degradation of the performance of the corresponding transistors.

In a NAND flash memory of gigabit grade, the cell gate length of 0.1 μm or less is used and the peripheral transistor gate length of about 0.1-0.3 μm is used. The NAND device with such small or short channel experiences a variety of problems, including leakage current. For this reason, many people have attempted to solve the leakage current and other short channel effects using various methods such as the Pocket and Halo technique.

FIG. 1 shows a layout of a typical transistor. In FIG. 1, "M" indicates metal, "CT" indicates a contact and "FOX" indicates a region between active regions, or a field region. Furthermore, to reduce the overall chip size and to maintain good transistor characteristics in the cell and peripheral regions, a wide active region width (ACT) shown in FIG. 1 has been used. However, a unit transistor is vulnerable to leakage current because of the effects of an extremely short channel. Problems arise when a program state and an erase state of a cell are erroneously read, a circuit malfunctions and/or the standby current is increased since it becomes more difficult to provide sufficient current as the active area decreases. As a result, the performance of the transistor suffers as the channel size shrinks.

FIG. 2 shows a sectional view of a transistor that is generally used in order to compensate for the leakage current problem resulting from the reduction of the gate length (or the channel size), as described above. A gate 140 is formed on a semiconductor substrate 100. The leakage current is compensated by reducing the depletion width of the junction through ion implant. Gate spacers 150 are formed on the sidewalls of the gate 140.

This method compensates for the leakage current by providing pocket and halo implants 130 that are selectively injected into the ends of the junction to reduce the depletion width of the junction. In addition, shallow junctions 120 are formed to compensate for the problem of a deep junction 110. To reduce Rs (surface resistance) and Rc (contact resistance), methods such as forming an amorphous junction through implantation of Si and Ge have been used.

However, such a method is difficult to implement, and also it is difficult to uniformly obtain the desired characteristics for each unit transistor. Consequently, reducing the chip size while maintaining the desired transistor characteristics represent a difficult challenge for the semiconductor industry.

BRIEF SUMMARY OF THE INVENTION

Embodiments of the present invention relate to forming a transistor in a memory device, such as a NAND device. The transistor is formed in such a way that the performance of a transistor in a cell region and a peripheral region (or peri-region) is improved by using a step STI profile, which uses spacers. A wide active region width, wider than the actual STI pitch, is obtained under this method.

An embodiment of the present invention provides a method of forming a transistor of a NAND flash memory device using a step element isolation film profile, including the steps of forming a pad oxide film and an insulation nitride film on a semiconductor substrate; forming trenches for isolation through a mask pattern; forming sidewall oxide films within the trenches; forming a high density plasma oxide film on the entire surface of the semiconductor substrate so that the trenches are completely filled; removing the high density plasma oxide film using a CMP process so that the insulation nitride film is exposed; removing the insulation nitride film to form an isolation film; forming step element isolation film spacers on both sidewalls of the isolation film; and removing the pad oxide film by a step element isolation film etch process to form a step element isolation film profile.

In one embodiment, a method of forming a memory device includes forming first and second isolation structures on a semiconductor substrate, the first and second isolation structures defining an active region therebetween; and etching a portion of the semiconductor substrate provided within the active region to define a step profile, so that the active region includes a first vertical portion and an upper primary surface, the first vertical portion extending above the upper primary surface. The isolation structure is a shallow trench isolation structure.

DETAILED DESCRIPTION OF SPECIFIC EMBODIMENTS

The present invention will now be described in detail using specific embodiments and the accompanying drawings.

FIGS. 3A-3E are sectional views for illustrating a method of forming a NAND flash memory device using a step STI profile according to an embodiment of the present invention. A step STI process is performed to define an active region of sufficient size for a transistor while reducing the chip size.

Figure 1:
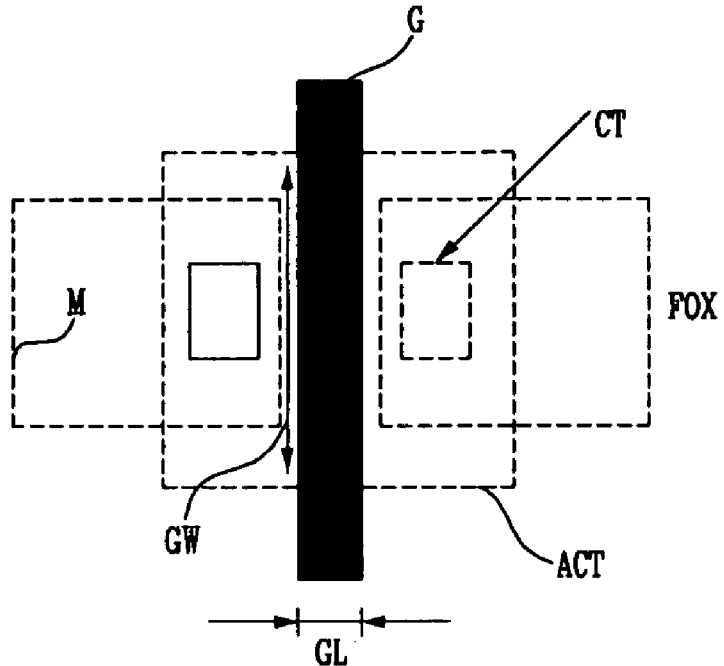
FIG. 1 shows a layout of a typical transistor.
Figure 2:
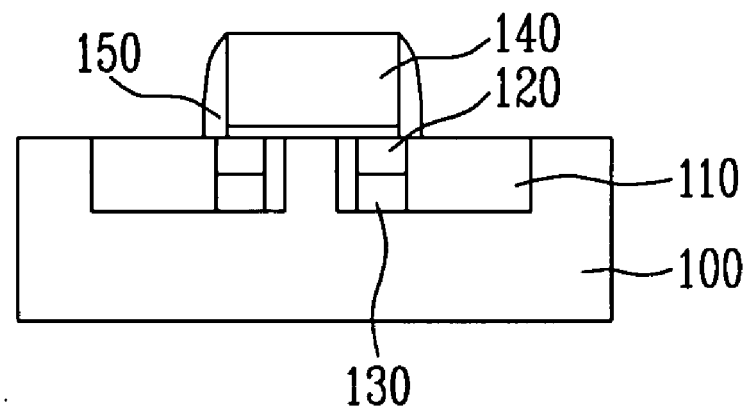
FIG. 2 is a sectional view of a typical transistor.
Figure 3A:
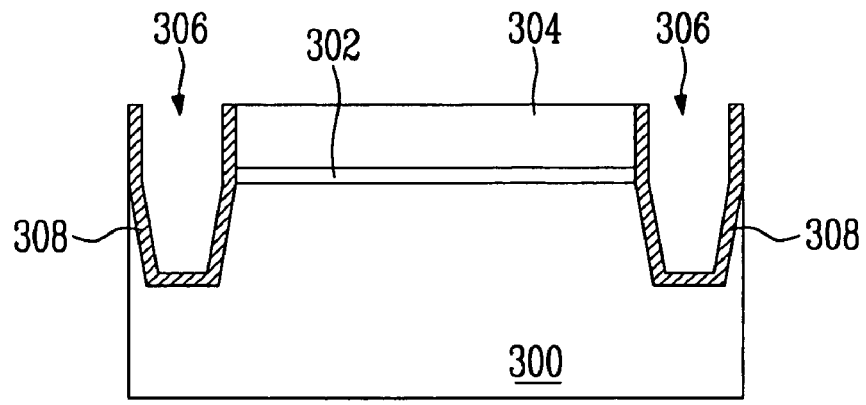
FIGS. 3A-3E are illustrate a method of forming a transistor of a NAND flash memory device using a step STI profile according to an embodiment of the present invention.

Referring to FIG. 3A, a pad oxide film 302 and a STI nitride film 304 are sequentially formed on a semiconductor substrate 300. A STI mask (not shown) is formed on the semiconductor substrate 300. As used herein, the terms "on" is used to refer to a position of a first object that lies over a second object, where the first and second objects may or may not be in direct contact with each other. The STI nitride film 304, the pad oxide film 302, and the semiconductor substrate 300 are selectively etched by a photolithography method using the STI mask (not shown) to form trenches 306 in predetermined regions (or field regions (FOX)) of the semiconductor substrate 300. After the STI mask (not shown) is removed, a sidewall oxidization process is performed to form an oxide film (or sidewall oxide film) 308 on the trenches 306. The sidewall oxide film 308 is etched to remove it from the nitride film 304. The resulting oxide film 308 serves as a lining or coating for the trenches 306.

Figure 3B:
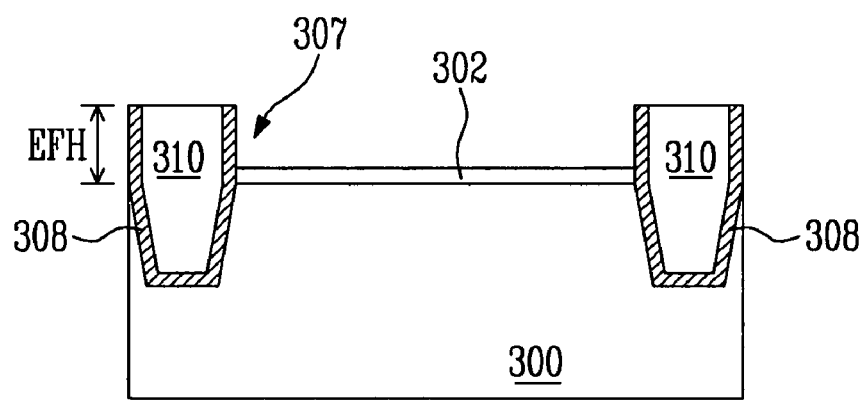

Referring to FIG. 3B, a gap fill process is performed to completely fill the trenches 306 by depositing dielectric material, e.g., High Density Plasma (HDP) oxide film 310, over the semiconductor substrate 300. The HDP oxide film 310 is removed using a Chemical Mechanical Polishing (CMP) process until the STI nitride film 304 is substantially exposed. A cleaning process may also be performed after the CMP process to remove the residues from the CMP process. The exposed STI nitride film 304 is removed to form a STI profile 307. The height between the upper surface of the semiconductor substrate 300 and the upper surface of the STI structure is referred to as Effective FOX Height (EFH). EFH serves to form a "moat" around the active region and prevents damages to the tunnel oxide film that is to be subsequently formed. EFH is 200 Å to 500 Å according to one embodiment, but may be of a different height in other embodiments.

Figure 3C:
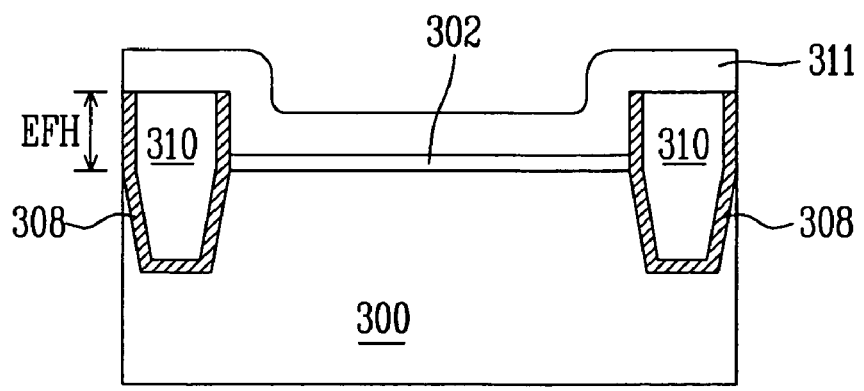

Referring to FIG. 3C, a dielectric layer (an oxide or nitride film) 311 is formed over the STI profile 307 and the substrate to a given thickness, e.g., using LP-TEOS, HTO, or MTO. The deposition thickness of the dielectric layer 311 determines the width of the step STI spacers to be formed (see FIG. 3D).

Figure 3D:
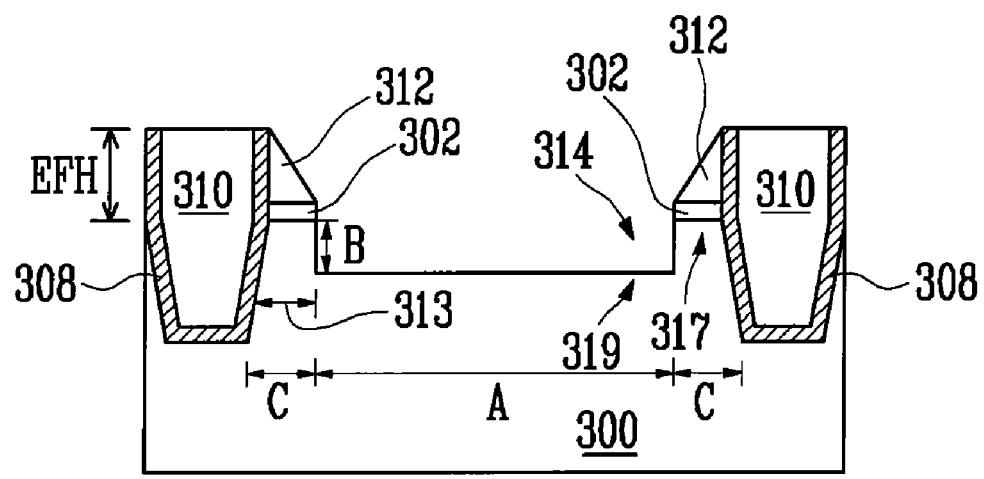

Referring to FIG. 3D, the dielectric layer 311 is etched to form step STI spacers 312 on the sidewalls of the STI profile. The etch process is performed, so that each of the step STI spacers 312 slopes down from the upper surface of the STI structure toward the active region. The etch process is an isotropic etch in the present embodiment. The step STI spacers are provided with a width 313 of 100 Å to 1000 Å in the present embodiment. If the width 313 is not of a sufficient thickness, a portion of the active region that is to be provided below the STI spacer 312 would be of insufficient thickness, making it difficult to effectively function as an active area. The deposition of the dielectric layer 311 may be used to control the width of the spacer since the width 313 corresponds to the thickness of the dielectric layer 311. Although the STI spacers 312 are described as having a sloping shape, they may have a different shape in other implementations (e.g., a rectangular shape). The sloping shape of the STI spacer makes the subsequent deposition of gate material easier to implement in the present embodiment.

To form a step STI profile 314, a portion of the silicon substrate 300 not covered by the STI spacer 312 are etched. That is, the spacers 312 are used as masks for the silicon etch. The substrate is etched to a depth of B. The maximum dimension for the depth B depends in part on the subsequent gate formation technology. For example, the higher the trench aspect ratio (i.e., the depth-to-width), the more difficult it is to completely fill the trench without voids with the polysilicon, which is one of the gate materials used for the NAND device.

With the formation of the step STI profile 314, the active width is increased as much as twice that of the depth B. The resulting increase in the active area enables the on-current of the transistor to be increased. As shown in FIG. 3D, the total active width of the unit transistor without the step STI is A+2C. With the step STI profile 314, the active width increases by as much as 2B, as shown in FIG. 3D. That is, the total active width becomes A+2C+2B, "A" indicates the space provided between the two step STI profiles 314, "B" indicates the depth of the step STI profile 314 and "C" indicates the width of the step STI spacers 312. Accordingly, the formation of the step STI profile 314 has increased the active area associated with the cell, thereby improving the performance of a unit transistor without increasing the cell size with respect to the surface of the substrate. Alternatively, a reduced cell size can be obtained while maintaining the same transistor performance (e.g., with respect to the on-current amount).

In addition, since the active width per unit cell of a memory device (e.g., NAND flash memory device) has been increased, the Fouler-Nordheim (FN) current (depending on an increased width of the active region) is also increased, resulting in faster program speed.

Figure 3E:
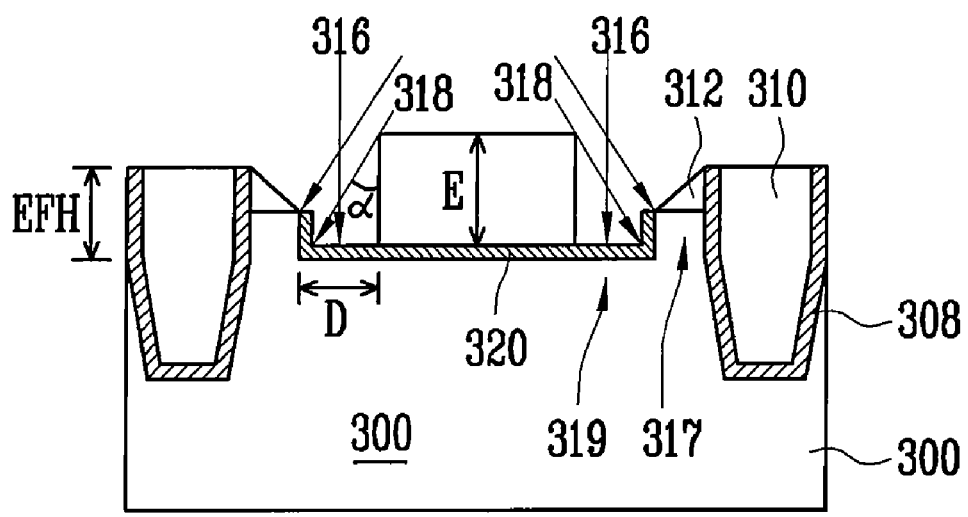

Referring to FIG. 3E, after the step STI profile 314 has been formed, first and second junction implantation steps 316 and 318 are performed to form doped regions (e.g., source and drain regions) according to one embodiment. Since a vertical portion 317 of the active area is formed adjacent to the STI profile 307 and above the primary upper surface of the active area, the junction implantation process needs to be performed on the vertical portion 317 as well as in a region 319 that is adjacent to the gate structure. A vertical implantation step 316 is performed to implant the ions in the region 319 (the first implantation step). The vertical implantation step is provided with an implantation angle of 0 degree (i.e., the ions are entering the substrate substantially orthogonal to the surface of the substrate). A slanted implantation step 318 is used to implant the ions in the vertical portion 317 (the second implantation step). The slanted implantation step is performed by adding about 4-15 degrees to the vertical implantation step. The slanted implantation step 318 is performed so that $\tan(\alpha) < D/E$, where D is a distance between the gate and the vertical portion 317, and E is a gate height. The steps 316 and 318 may be performed in a reversed order in other applications. The steps 316 and 318 may also be performed one after another repeatedly until the vertical portion 317 and the region 319 have been provided with a desired dopant concentration.

After performing the implantation steps, a tunnel oxide 320 is formed. The tunnel oxide 320 is formed using a radical tunneling oxidation process in one embodiment. A polysilicon layer is deposited on the substrate over the tunnel oxide 320 and within the two STI profiles 314. The aspect ratio (AR), i.e., the depth (B) to the space (A) of the step STI profile 314 shown in FIG. 3E should not be too high, so that the polysilicon is deposited without voids.

In the present embodiment, after the formation of the step STI profile 314 and prior to the formation of the tunnel oxide 320, an annealing step is performed in an oxygen environment to round the bottom corners of the STI profiles 314. The annealing is performed at 800.degree. to 1100.degree. to form an oxide film having 10 .ANG. to 30 .ANG. in thickness. Thereafter, the oxide film is removed, e.g., using a wet etch process, leaving the corners rounded. In addition, the damages to the silicon crystal resulting from the silicon etch are repaired by the annealing step.

If the tunnel oxide 320 is formed directly over the substrate (i.e., directly over the sharp corner portions of the STI profiles 314) without this annealing step, an oxide thinning phenomenon may occur at the corners. If oxide thinning occurs, there is a high possibility that a hump may be generated in the transistor. After the tunnel oxide 320 has been formed, additional processes are performed to fabricate the memory device.

Figure 4A:
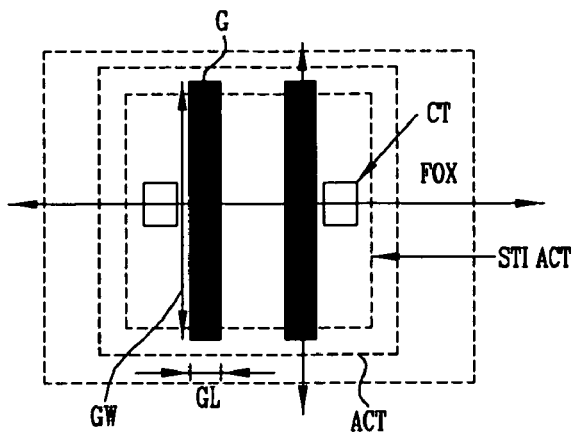
FIG. 4A shows a layout of an active region in which a step STI active region width is obtained according to one embodiment of the present invention.
Figure 4B:
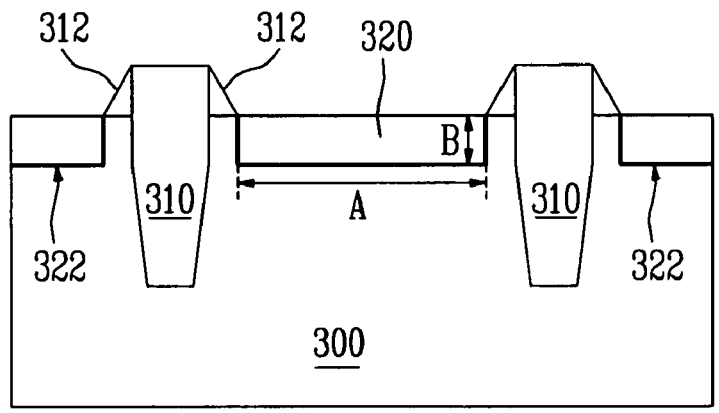
FIGS. 4B and 4C illustrate cross-sectional views of the active region of FIG. 4A.
Figure 4C:
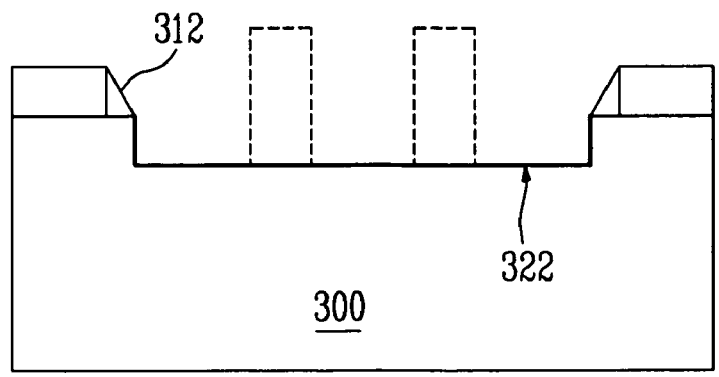

FIG. 4A shows a top view of a layout of a memory cell having the step STI profiles to increase the active width according to one embodiment of the present invention. As shown in FIG. 4A, a step STI active (STI ACT) region is formed within in an active region (ACT). The STI ACT is a region defined between the step STI profiles 314. As a result, the ACT region is configured to be wider than the conventional active region by twice the depth of the step STI profile. FIG. 4B illustrates a cross-sectional view of the memory cell of FIG. 4A taken along the arrow BB. As shown, a polysilicon layer 320 is deposited between the step STI profiles 314. FIG. 4C illustrates a cross-sectional view of the memory cell of FIG. 4A taken along the arrow CC. The increase in the active width is illustrated by numeral 322.

As mentioned above, according to the present invention, a step STI profile is formed through formation of spacers and etch. As a result, a wide active width can be secured and the performance of a transistor in a cell region and a peri region can be improved. Furthermore, since the chip size can be reduced to save manufacturing cost per bit. The cell current and the program speed can be improved. Although the foregoing description has been made with reference to the preferred embodiments, it is to be understood that changes and modifications of the present invention may be made by the ordinary skilled in the art without departing from the scope of the present invention and appended claims.

What is claimed is:

1. A method of forming a memory device, comprising:
    forming first and second isolation structures on a semiconductor substrate, the first and second isolation structures defining an active region therebetween;
    forming STI spacers on sidewalls of the first and the second isolation structures;
    forming a trench having a width narrower than a distance between the first isolation structure and the second isolation structure to form a step profile in the active region by etching the semiconductor substrate using the STI spacers as an etching mask; and
    forming a doped region to be used as a source region or a drain region in a bottom side of the trench and in a sidewall of the trench by performing an ion implantation process,
    wherein the doped region is formed after forming the first and second isolation structures.

2. The method of claim 1, wherein the STI spacers are formed to a thickness of 100 Å to 1000 Å.

3. The method of claim 1, wherein the slanted implantation method involves implanting the dopants into the active region using an implantation angle of 4-15 degrees.

4. The method of claim 1, wherein the vertical implantation method involves implanting the dopants into the active region using an implantation angle of substantially 0 degree.

5. The method of claim 1, wherein the STI spacers are formed using one of an oxide film or a nitride film.

6. The method of claim 1, the method further comprising:
    performing an annealing process to form an oxide film;
    removing the oxide film, using a wet etching process, leaving corners of the STI profiles rounded; and
    forming a tunnel oxide film over the semiconductor substrate within the active region using a radical oxidization process.

7. The method of claim 2, wherein the STI spacers are formed using LP-TEOS, HTO, or MTO.

8. The method of claim 6, wherein the oxide film is formed at a temperature between 800° C. and 1100< C. and a thickness of 10 Å to 30 Å.

9. A method of forming a memory device, comprising:
    forming first and second isolation structures on a semiconductor substrate, the first and second isolation structures defining an active region therebetween;
    forming first and second spacers provided adjacent to the first and second isolation structures, respectively, the first and second spacers exposing a portion of the substrate;
    etching the exposed portion of the substrate to define a step profile, so that the active region includes first and second vertical portions and an upper primary surface, the first and second vertical portions extending above the upper primary surface, the first vertical portion being provided directly below the first spacer, the second vertical portion being provided directly below the second spacer;
    forming a doped region to be used as a source region or a drain region in a bottom side of the step profile and in a sidewall of the step profile by performing an ion implantation process, wherein the doped region is formed after forming the first and second isolation structures;
    annealing the semiconductor substrate after the etching step to round a corner defined by the step profile;
    removing an oxide film formed over the substrate as a result of the annealing; and
    thereafter, forming a tunnel oxide over the semiconductor substrate within the active region, wherein the tunnel oxide is formed using a radical oxidization process.

10. The method of claim 1, wherein the ion implantation process includes a vertical implantation and a slanted implantation methods.

11. The method of claim 9, wherein the ion implantation process includes a vertical implantation and a slanted implantation methods.

* * * * *